United States Patent
Kim

(10) Patent No.: US 8,432,757 B2
(45) Date of Patent: Apr. 30, 2013

(54) SEMICONDUCTOR SYSTEM AND METHOD FOR OPERATING THE SAME

(75) Inventor: Mi-Hye Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/978,147

(22) Filed: Dec. 23, 2010

(65) Prior Publication Data

US 2012/0106272 A1     May 3, 2012

(30) Foreign Application Priority Data

Oct. 28, 2010  (KR) .................. 10-2010-0106091

(51) Int. Cl.
*G11C 7/00*     (2006.01)

(52) U.S. Cl.
USPC ............ 365/198; 365/191; 714/700; 714/724

(58) Field of Classification Search ............. 365/189.17, 365/191, 194, 198; 714/700, 724
See application file for complete search history.

(56) References Cited

U.S. PATENT DOCUMENTS

| | | | | |
|---|---|---|---|---|
| 5,737,589 A * | 4/1998 | Doi et al. | ....................... | 713/503 |
| 6,184,708 B1 | 2/2001 | Jenkins | | |
| 6,320,407 B1 | 11/2001 | Sakamoto | | |
| 6,452,428 B1 | 9/2002 | Mooney et al. | | |
| 7,330,993 B2 | 2/2008 | Deshmane et al. | | |
| 7,598,785 B2 | 10/2009 | Im et al. | | |
| 7,725,778 B2 * | 5/2010 | Funaba et al. | ................. | 714/700 |
| 7,741,894 B2 | 6/2010 | Kojima | | |
| 2004/0054845 A1 | 3/2004 | Ware et al. | | |
| 2004/0213067 A1 * | 10/2004 | Best et al. | ...................... | 365/222 |

FOREIGN PATENT DOCUMENTS

KR       100161464       3/1999
KR     1020050062036    6/2005

OTHER PUBLICATIONS

Preliminary Rejection issued by the Korean Intellectual Property Office on Nov. 29, 2012.

* cited by examiner

*Primary Examiner* — VanThu Nguyen
(74) *Attorney, Agent, or Firm* — IP & T Group LLP

(57) ABSTRACT

A semiconductor memory device includes a pattern data generator configured to generate certain pattern data in a training operation mode, and an output driver configured to drive the pattern data to output training data with a slew rate corresponding to an external command in the training operation mode.

16 Claims, 8 Drawing Sheets

FIG. 7
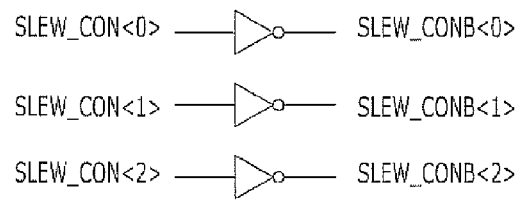
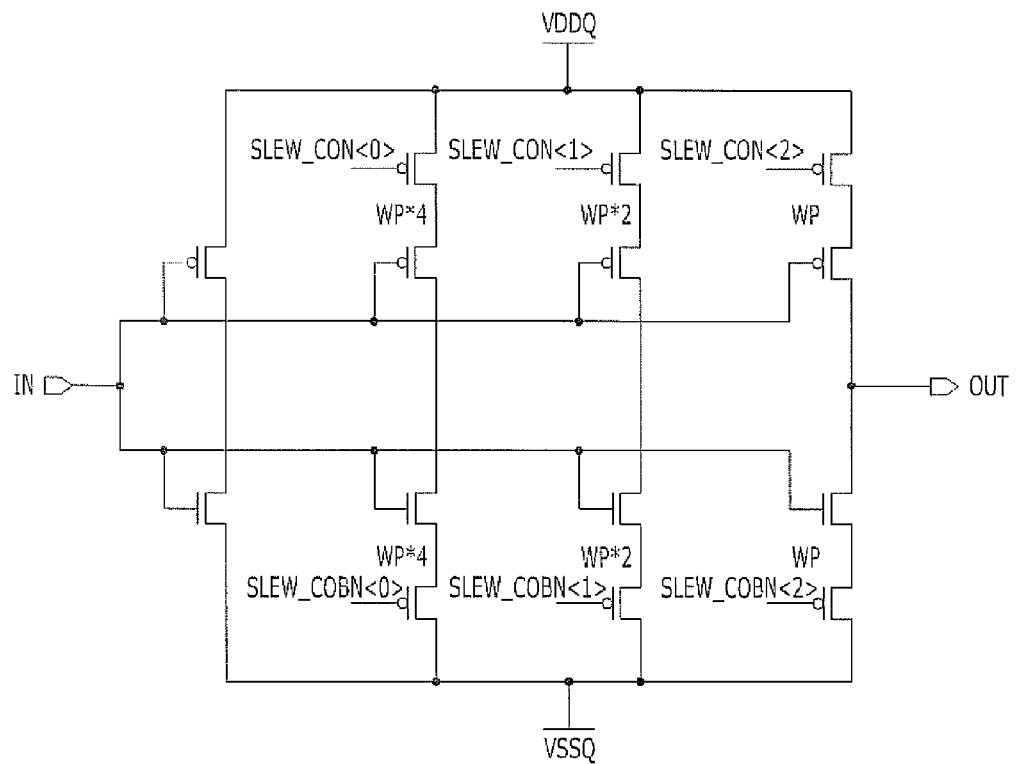

US 8,432,757 B2

SEMICONDUCTOR SYSTEM AND METHOD FOR OPERATING THE SAME

CROSS-REFERENCE TO RELATED APPLICATIONS

The present application claims priority of Korean Patent Application No. 10-2010-0106091, filed on Oct. 28, 2010, which is incorporated herein by reference in its entirety.

BACKGROUND OF THE INVENTION

Exemplary embodiments of the present invention relate to a semiconductor designing technology, and more particularly, to a circuit for training/controlling a slew rate of data outputted from a semiconductor memory device.

A semiconductor memory device includes hundreds of memory cells, and the basic functions of the memory cells are to input/output data to write data in a memory cell or read data that has been already written in a memory cell. Semiconductor memory devices including Synchronous Dynamic Random Access Memory (SDRAM), Double Data Rate (DDR) DRAM, and DDR3 DRAM may perform a variety of different functions, but their basic characteristics such as having memory cells and refreshing the memory cells are similar.

Semiconductor memory devices may be developed for writing/reading data at a high speed and reducing production costs while retaining the inherent characteristics.

FIG. 1 is a block diagram illustrating a conventional semiconductor memory device. The conventional semiconductor memory device includes a command and address buffer 102, a row decoder 103, a column decoder 104, a DRAM core 105, a data input buffer 107, a data input register 108, a data output register 109, a data output buffer 110. Since the functions of the above-mentioned constituent elements are obvious to those skilled in the art to which the present invention pertains, further description of them will not be provided herein and only a constituent block related to an exemplary embodiment of the present invention will be described briefly hereafter.

The DRAM core 105 includes a DRAM memory cell and a sense amplifier which amplifies a data stored in the memory cell. The row decoder 103 and the column decoder 104 perform a function of selecting the memory cell on a position corresponding to an address and a command transferred from the outside. Here, the command includes commands in charge of row access and column access in the operation of a DRAM device, such as a Row Address Strobe (RAS) signal, a Column Address Strobe (CAS) signal, and a Write Enable (WE) signal.

As a row address is inputted at the moment when the row address strobe (RAS) signal is enabled, and the row decoder 103 decodes the received row address to enable a plurality of memory cells. Data stored in the DRAM cells are amplified by a sense amplification operation of the DRAM core 105. In short, a sense amplifier inside the DRAM core 105 performs a function of a data cache which waits for a read operation or a write operation while retaining amplified data.

In case of a read operation, when a column address strobe (CAS) signal is enabled, a column address is decoded simultaneously and data are outputted from a sense amplifier group which performs a function of a data cache to an internal data bus. The outputted data are stored in the data output register 109. The data stored in the data output register 109 are outputted through the data output buffer 110 at a predetermined time.

FIG. 2 is a circuit diagram illustrating a circuit of the conventional data output buffer 110 illustrated in FIG. 2.

The data output buffer 110 includes a pre-driver 201 and a main driver 202. The pre-driver 201 determines the logic state of an outputted data, and when no data is outputted it keeps the main driver 202 at a high impedance state which is a Hi-Z state. Here, a driving power source VDDQ is a high-voltage power source, and a ground power source VSSQ is a low-voltage power source.

When an L (logic low) state value is inputted to an up data input part UP_DATA of the pre-driver 201 and a H (logic high) state value is inputted to a down data input part DN_DATA of the pre-driver 201, the H state value is inputted to a PMOS gate of the main driver 202 and the L state value is inputted to an NMOS gate of the main driver 202. Therefore, an output end OUT of the data output buffer 110 maintains a high impedance state (a Hi-Z state) which is neither an H state nor an L state.

Meanwhile, when an H state value is inputted to the up data input part UP_DATA and the down data input part DN_DATA of the pre-driver 201, an L state value is inputted to the PMOS and NMOS gates of the main driver 202. Therefore, an H-state data may be outputted from the output end OUT of the data output buffer 110. Conversely, when an L state value is inputted to the up data input part UP_DATA and the down data input part DN_DATA of the pre-driver 201, an H state value is inputted to the PMOS and NMOS gates of the main driver 202. Therefore, an L-state data may be outputted from the output end OUT of the data output buffer 110.

A data DATA outputted from the data output buffer 110 may be outputted to an input/output pin 106. Here, the slope of an outputted signal changing between L and H states is referred to as a slew rate. The slew rate is represented, for example, by 3V/ns, which means that a signal rises/falls by 3V in 1 nanosecond (ns).

The slew rate is determined by the size of a transistor in the pre-driver 201 illustrated in FIG. 2. The slew rate may be determined based on the size of the transistor, and also based on diverse norms such as resistance. In this embodiment, however, it is assumed that the slew rate is determined based on the size of the transistor.

According to the conventional technology, the slew rate is provided as a fixed value which is determined at the stage of designing a DRAM device. Therefore, when the slew rate is high, signal quality is deteriorated due to bounce noise, and when the slew rate is too low, signal quality is deteriorated because the variation width of access time becomes too wide. Here, the signal quality may be signal integrity. When signals are outputted for a predetermined time period, a time occupied by outputted data and a time occupied between the outputted data are determined in the time period. Here, fine signal integrity signifies that the time occupied by the data is relatively longer than the other.

However, since the slew rate is provided as a fixed value determined when the DRAM device is designed according to the conventional technology, the slew rate cannot be controlled after the DRAM device product is designed, which may be a drawback of the conventional technology.

SUMMARY OF THE INVENTION

An exemplary embodiment of the present invention is directed to a semiconductor memory device which may perform a slew rate training operation for controlling the slew rate of an outputted data, and a semiconductor system including the semiconductor memory device.

In accordance with an exemplary embodiment of the present invention, a semiconductor memory device includes: a pattern data generator configured to generate certain pattern data in a training operation mode; and an output driver configured to drive the pattern data to output training data with a slew rate corresponding to an external command in the training operation mode.

In accordance with another exemplary embodiment of the present invention, a semiconductor system includes: a memory controller configured to detect a slew rate of training data in a training operation mode and determine whether to generate a predetermined command based on a slew rate detection result; and a semiconductor memory device configured to control the slew rate of the training data in response to the predetermined command and output the training data to the memory controller in the training operation mode.

In accordance with yet another exemplary embodiment of the present invention, a method for operating a semiconductor system comprising a semiconductor memory device and a memory controller includes: entering a training operation mode in response to a training operation command being enabled; controlling a slew rate of training data in response to a predetermined command in the training operation mode; and detecting the slew rate of the training data to produce a slew rate detection result and determining whether or not generate the predetermined command based on the slew rate detection result.

BRIEF DESCRIPTION OF THE DRAWINGS

FIG. 7 is a circuit diagram illustrating an exemplary embodiment of a plurality of pre-driving units of the pre-driver shown in FIG. 6.

DESCRIPTION OF SPECIFIC EMBODIMENTS

Figure 1:
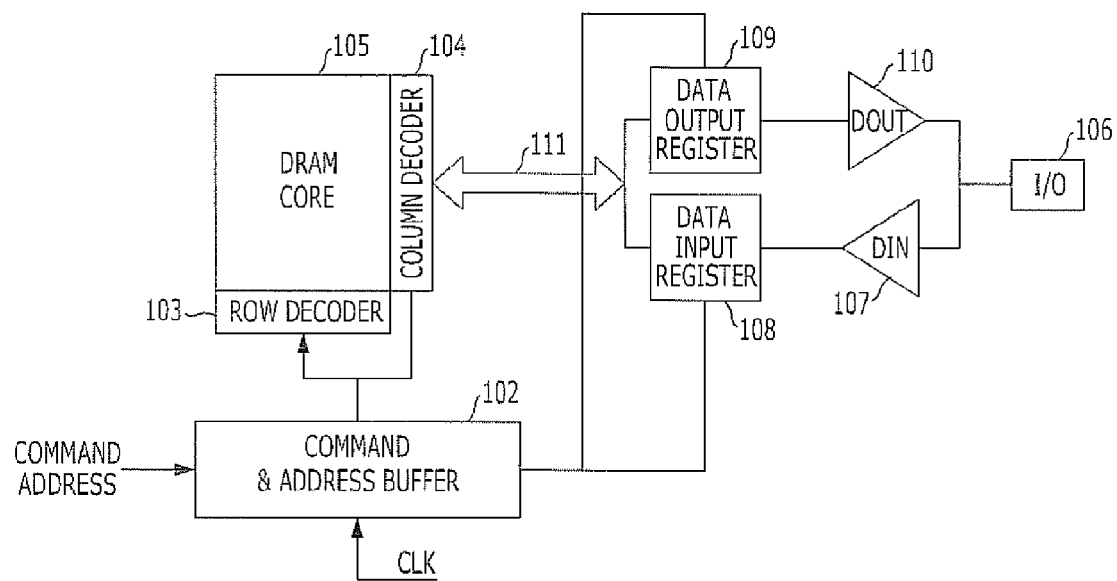
FIG. 1 is a block diagram illustrating a conventional semiconductor memory device.
Figure 2:
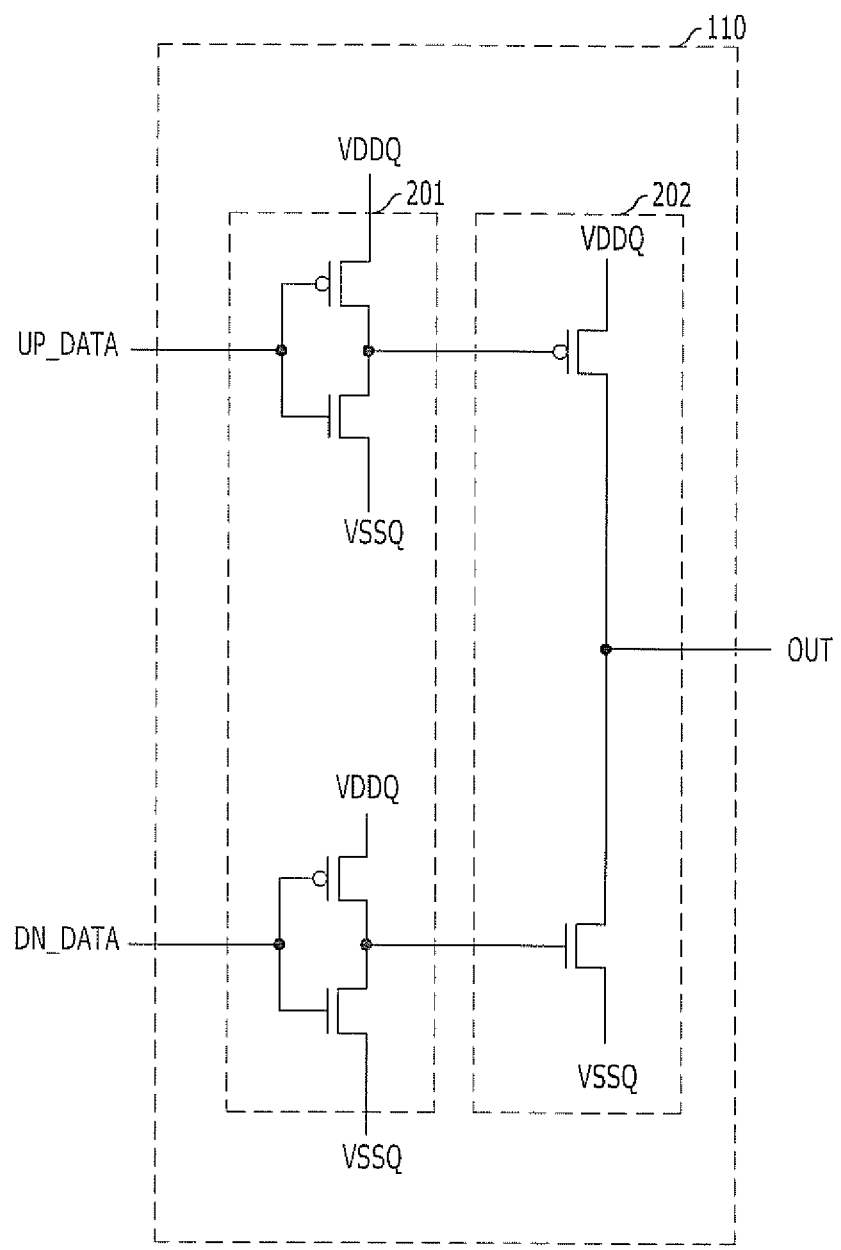
FIG. 2 is a circuit diagram illustrating a circuit of a data output buffer among the constituent elements of the conventional semiconductor memory device shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
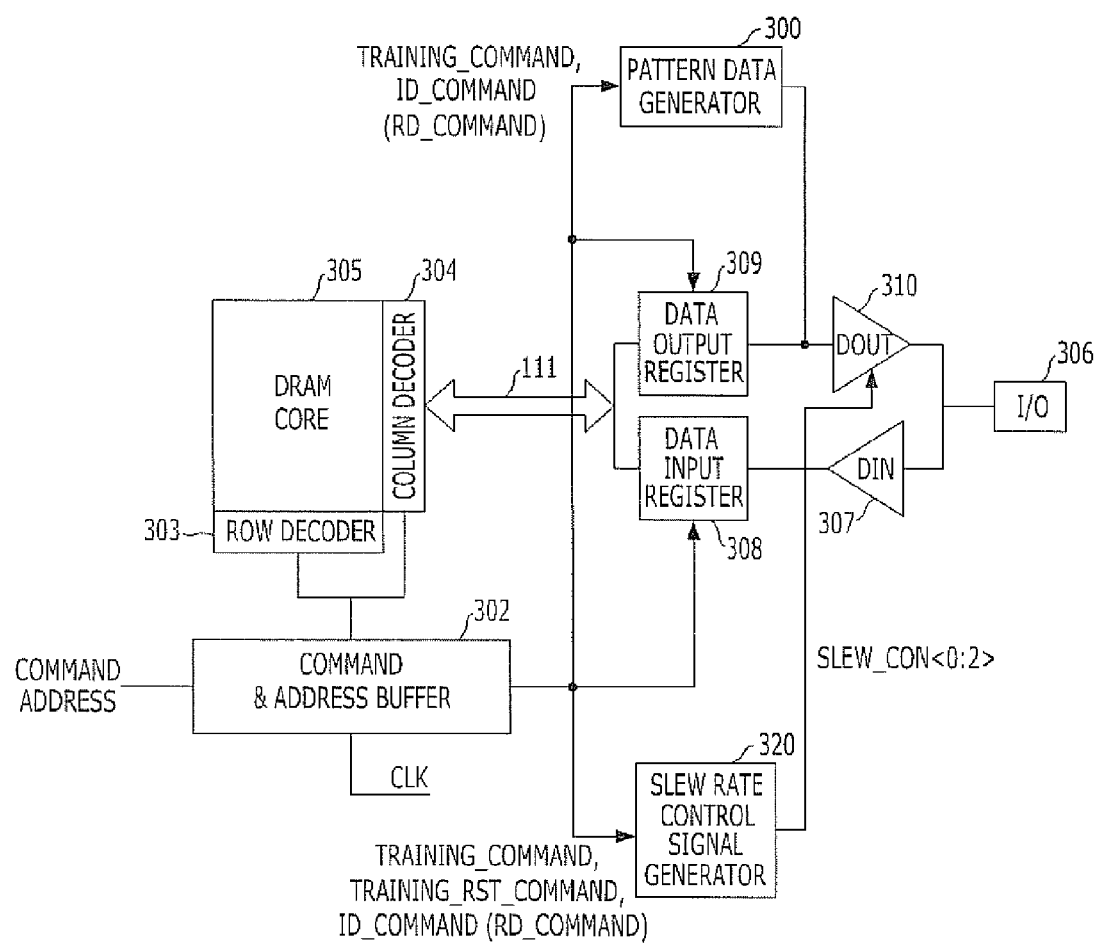
FIG. 3 is a block diagram of a semiconductor memory device in accordance with an exemplary embodiment of the present invention.

FIG. 3 is a block diagram of a semiconductor memory device in accordance with an exemplary embodiment of the present invention.

Referring to FIG. 3, the semiconductor memory device fabricated according to this exemplary embodiment of the present invention may be similar in its structure to the conventional semiconductor memory device illustrated in FIG. 1. However, a pattern data generator 300 and a slew rate control signal generator 320 are added and the structure of a data output buffer 310 is different from that of the data output buffer 110.

The semiconductor memory device includes a command and address buffer 302, a row decoder 303, a column decoder 304, a DRAM core 305, a data input buffer 307, a data input register 308, a data output register 309, and a data output buffer 310. The DRAM core 305 includes a DRAM memory cell and a sense amplifier which amplifies a data stored in the memory cell. The row decoder 303 and the column decoder 304 perform a function of selecting the memory cell on a position corresponding to an address and a command transferred from the outside. Here, the command includes commands in charge of row access and column access in the operation of a DRAM device, such as a Row Address Strobe (RAS) signal, a Column Address Strobe (CAS) signal, and a Write Enable (WE) signal.

A row address is inputted at the moment when the row address strobe (RAS) signal is enabled, and the row decoder 303 decodes the received row address to enable a plurality of memory cells. Data stored in the DRAM cells are amplified by a sense amplification operation of the DRAM core 305. In short, a sense amplifier inside the DRAM core 305 performs a function of a data cache which waits for a read operation or a write operation while retaining amplified data.

In a read operation, when a column address strobe (CAS) signal is enabled, a column address is decoded simultaneously and data are outputted from a sense amplifier group which performs a function of a data cache to an internal data bus. The outputted data are stored in the data output register 309. The data stored in the data output register 309 are outputted through the data output buffer 310 at a predetermined time.

In the preferred embodiment, the pattern data generator 300 generates pattern data PT_DATA_UP and PT_DATA_DN having a pattern predetermined in a training operation mode.

The slew rate control signal generator 320 changes the value of a slew rate control signal SLEW_CON<0:2> in response to the predetermined command ID_COMMAND in a duration where a training operation command TRAINING_COMMAND, transferred from the outside to control the entry into the training operation mode, is enabled. In other words, the slew rate control signal generator 320 changes the value of the slew rate control signal SLEW_CON<0:2> whenever the predetermined command ID_COMMAND is inputted from the outside of the semiconductor memory device in a duration where the training operation command TRAINING_COMMAND is enabled, i.e., in a duration of the training operation mode. In a duration where the training operation command TRAINING_COMMAND is disabled and the pattern data generator 300 exits the training operation mode, the slew rate control signal generator 320 maintains the value of the slew rate control signal SLEW_CON<0:2> regardless of whether the predetermined command ID_COMMAND is inputted from the outside of the semiconductor memory device or not.

In the preferred embodiment, the data output buffer 310 drives the pattern data PT_DATA_UP and PT_DATA_DN, which are outputted from the pattern data generator 300, to have a slew rate corresponding to the slew rate control signal SLEW_CON<0:2>, which is inputted from the slew rate control signal generator 320, in the training operation mode.

Figure 4:
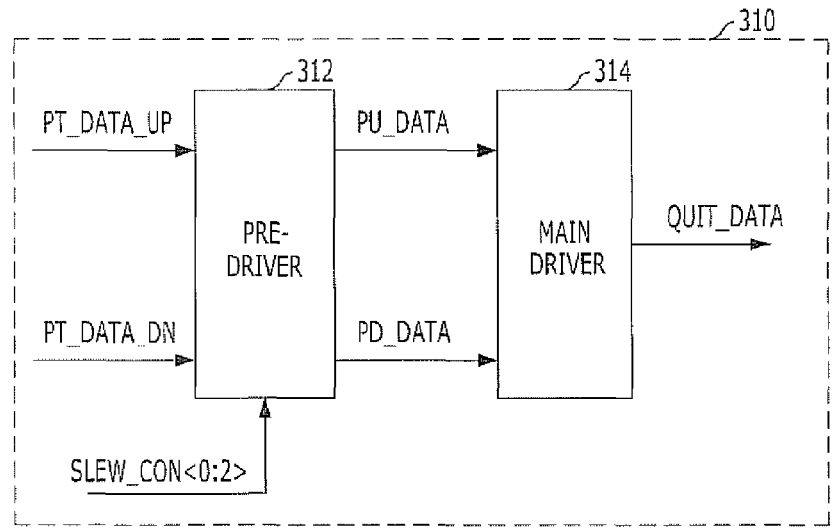
FIG. 4 is a block diagram illustrating a data output buffer among the constituent elements of the semiconductor memory device shown in FIG. 3.

FIG. 4 is a block diagram illustrating the data output buffer 310 among the constituent elements of the semiconductor memory device shown in FIG. 3.

Referring to FIG. 4, the data output buffer 310 includes a pre-driver 312 and a main driver 314. The pre-driver 312 generates a pull-up data PU_DATA and a pull-down data PD_DATA by driving the pattern data PT_DATA_UP and PT_DATA_DN to have a slew rate corresponding to the slew rate control signal SLEW_CON<0:2> which is changed based on a predetermined command ID_COMMAND transferred from the outside in the training operation mode. The main driver 314 outputs an output data QUIT_DATA which is generated by driving the pull-up data PU_DATA and the pull-down data PD_DATA to the outside.

Here, the pre-driver 312 drives the pattern data PT_DATA_UP and PT_DATA_DN with a driving force which varies corresponding to the slew rate control signal SLEW_CON_0:2>, which is inputted from the slew rate control signal generator 320 based on the predetermined command ID_COMMAND in the training operation mode, and generates the pull-up data PU_DATA and the pull-down data PD_DATA.

Figure 5:
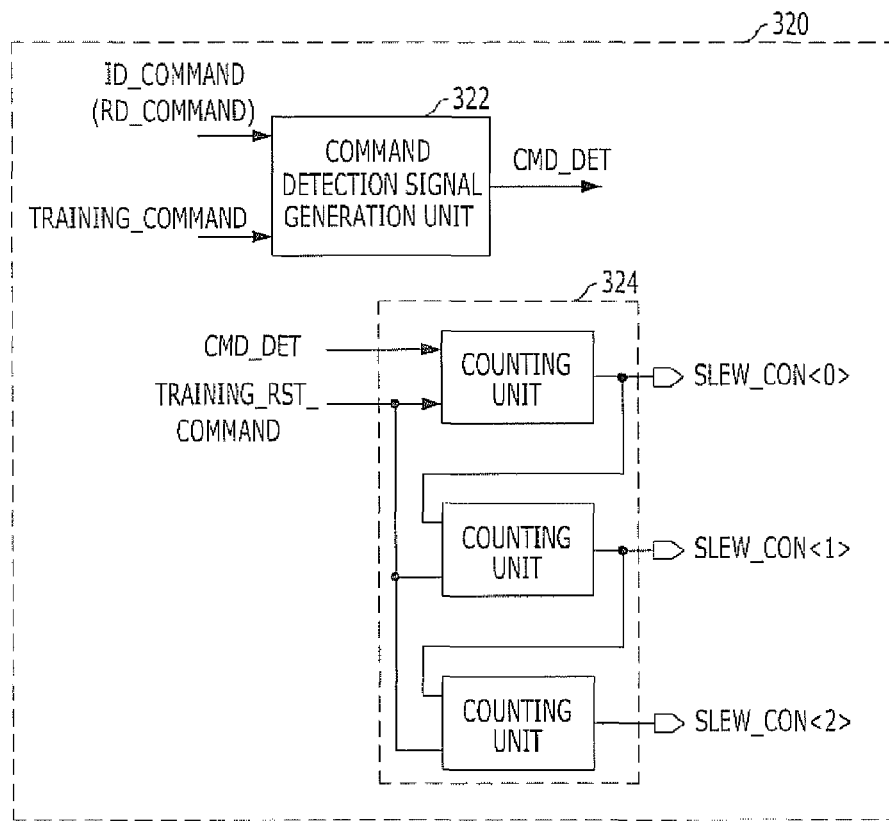
FIG. 5 is a block diagram illustrating a slew rate control signal generator among the constituent elements of the semiconductor memory device shown in FIG. 3.

FIG. 5 is a block diagram illustrating the slew rate control signal generator 320 among the constituent elements of the semiconductor memory device shown in FIG. 3.

Referring to FIG. 5, the slew rate control signal generator 320 includes a command detection signal generation unit 322 and a counting unit 324. The command detection signal generation unit 322 generates a command detection signal CMD_DET which is pulsed/activated whenever the predetermined command ID_COMMAND is inputted in the training operation mode where the training operation command TRAINING_COMMAND is enabled. The counting unit 324 counts the number of times the command detection signal CMD_DET toggles and determines the respective bit values of the slew rate control signal SLEW_CON<0:2> which is formed of a plurality of bits.

Here, the counting unit 324 controls the number of enabled bits and disabled bits of the slew rate control signal SLEW_CON<0:2> based on the number of toggles (toggling number) of the command detection signal CMD_DET. Here, since the operation of the command detection signal generation unit 322 is controlled based on whether the semiconductor memory device enters or exits the training operation mode, the toggling number of the command detection signal CMD_DET is counted based on the same. In short, in a duration where the training operation command TRAINING_COMMAND is enabled and the pattern data generator 300 operates in the training operation mode, it is determined whether to enable or disable each bit of the slew rate control signal SLEW_CON<0:2> by counting the toggling number of the command detection signal CMD_DET. However, when the training operation command TRAINING_COMMAND is disabled and the semiconductor memory device operates out of the training operation mode, the command detection signal CMD_DET does not toggle any more and the counting unit 324 does not determine whether to enable or disable each bit of the slew rate control signal SLEW_CON<0:2>.

Also, the counting unit 324 may reset the enabling or disabling state of each bit of the slew rate control signal SLEW_CON<0:2>, which is determined in a duration where the training operation command TRAINING_COMMAND is enabled, into the initial state in response to a training reset command TRAINING_RST_COMMAND, which is transferred from the outside. Otherwise, the counting unit 324 maintains the state of the slew rate control signal SLEW_CON<0:2> in a duration where the training operation command TRAINING_COMMAND is disabled.

In short, the counting unit 324 controls whether to enable or disable each bit of the slew rate control signal SLEW_CON<0:2> in a duration where the training operation command TRAINING_COMMAND is enabled. Therefore, when the training operation command TRAINING_COMMAND is enabled and then disabled, the enabling or disabling state of each bit of the slew rate control signal SLEW_CON<0:2> may become different from the predetermined initial enabling or disabling state. As described above, the counting unit 324 controls whether to reset the state of each bit of the slew rate control signal SLEW_CON<0:2> into the initial state or to maintain it at the state determined in a duration where the training operation command TRAINING_COMMAND is enabled, based on the training reset operation command TRAINING_RST_COMMAND, which is transferred from the outside.

Figure 6:
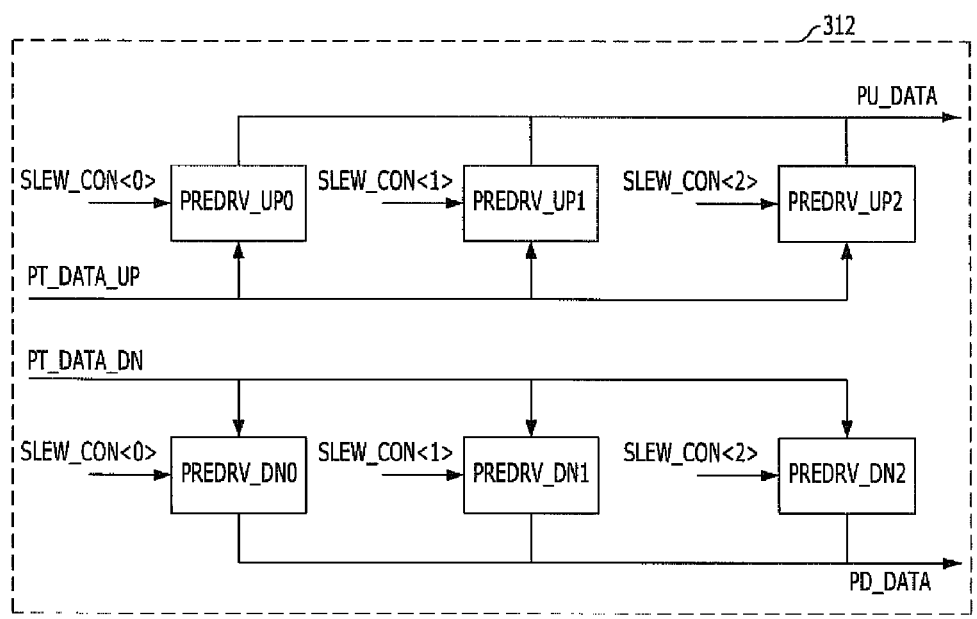
FIG. 6 is a block diagram illustrating a pre-driver included in the data output buffer shown in FIG. 4.

FIG. 6 is a block diagram illustrating the pre-driver 312 included in the data output buffer 310 shown in FIG. 4.

Referring to FIG. 6, the pre-driver 312 in accordance with an exemplary embodiment of the present invention outputs the pull-up data PU_DATA and the pull-down data PD_DATA by driving the pattern data PT_DATA_UP and PT_DATA_DN and includes a plurality of pre-driver units PREDRV_UP0, PREDRV_DN0, PREDRV_UP1, PREDRV_DN1, PREDRV_UP2, and PREDRV_DN2.

Also, the plurality of the pre-driver units PREDRV_UP0, PREDRV_DN0, PREDRV_UP1, PREDRV_DN1, PREDRV_UP2, and PREDRV_DN2, whose driving operations are turned on/off individually in response to each bit of the slew rate control signal SLEW_CON<0:2>, have the circuit structure shown in FIG. 7. To be specific, the plurality of the pre-driver units PREDRV_UP0, PREDRV_DN0, PREDRV_UP1, PREDRV_DN1, PREDRV_UP2, and PREDRV_DN2 output the pull-up data PU_DATA and the pull-down data PD_DATA in response to the pattern data PT_DATA_UP and PT_DATA_DN inputted to an input end IN. Here, the slew rates of the outputted pull-up data PU_DATA and the pull-down data PD_DATA may be changed according to how much driving force the pattern data PT_DATA_UP and PT_DATA_DN inputted to the input end IN are driven with. Therefore, the plurality of the pre-driver units PREDRV_UP0, PREDRV_DN0, PREDRV_UP1, PREDRV_DN1, PREDRV_UP2, and PREDRV_DN2 change the driving force in such a manner that they perform a driving operation selectively in response to each bit of the slew rate control signal SLEW_CON<0:2> and drive the pattern data PT_DATA_UP and PT_DATA_DN.

Here, the pattern data PT_DATA_UP and PT_DATA_DN are divided into an up pattern data PT_DATA_UP and a down pattern data PT_DATA_DN, and the plurality of the pre-driver units PREDRV_UP0, PREDRV_DN0, PREDRV_UP1, PREDRV_DN1, PREDRV_UP2, and PREDRV_DN2 are divided into a plurality of up pre-driver units PREDRV_UP0, PREDRV_UP1, and PREDRV_UP2 and a plurality of down pre-driver units PREDRV_DN0, PREDRV_DN1, and PREDRV_DN2. Thus, the up pre-driver units and down pre-driver units generate pull-up data PU_DATA and pull-down data PD_DATA, respectively. Since a structure for dividing the data inputted to a pre-driver into an up part and a down part is often used in general semiconductor memory devices, further description will not be provided herein.

Also, the circuit structure of the plurality of the pre-driver units PREDRV_UP0, PREDRV_DN0, PREDRV_UP1, PREDRV_DN1, PREDRV_UP2, and PREDRV_DN2 illustrated in FIG. 7 is just one of a number of diverse structures that may operate to control the slew rate of the inputted pattern data PT_DATA_UP and PT_DATA_DN, and such structure does not limit the scope and spirit of the present invention.

Also, the predetermined command ID_COMMAND used in exemplary embodiments of the present invention may correspond to a read command RD_COMMAND used in the general operation of a semiconductor memory device. In short, the pre-driver 312 may generate the pull-up data PU_DATA and the pull-down data PD_DATA by controlling the slew rate of the pattern data PT_DATA_UP and PT_DATA_DN based on the read command RD_COMMAND in a duration where the training operation command TRAINING_COMMAND is enabled. In addition, the pre-driver 312 may generate the pull-up data PU_DATA and the pull-down data PD_DATA by driving a normal data transferred from a core region inside of the semiconductor memory device in response to the read command RD_COMMAND in a duration where the training operation command TRAINING_COMMAND is disabled.

Of course, the predetermined command ID_COMMAND may correspond to any command as long as the command is transferred from the outside to the semiconductor memory device. That is, the command may be newly defined, and such correspondence between the predetermined command and others does not limit the scope and spirit of the present invention.

Figure 8:
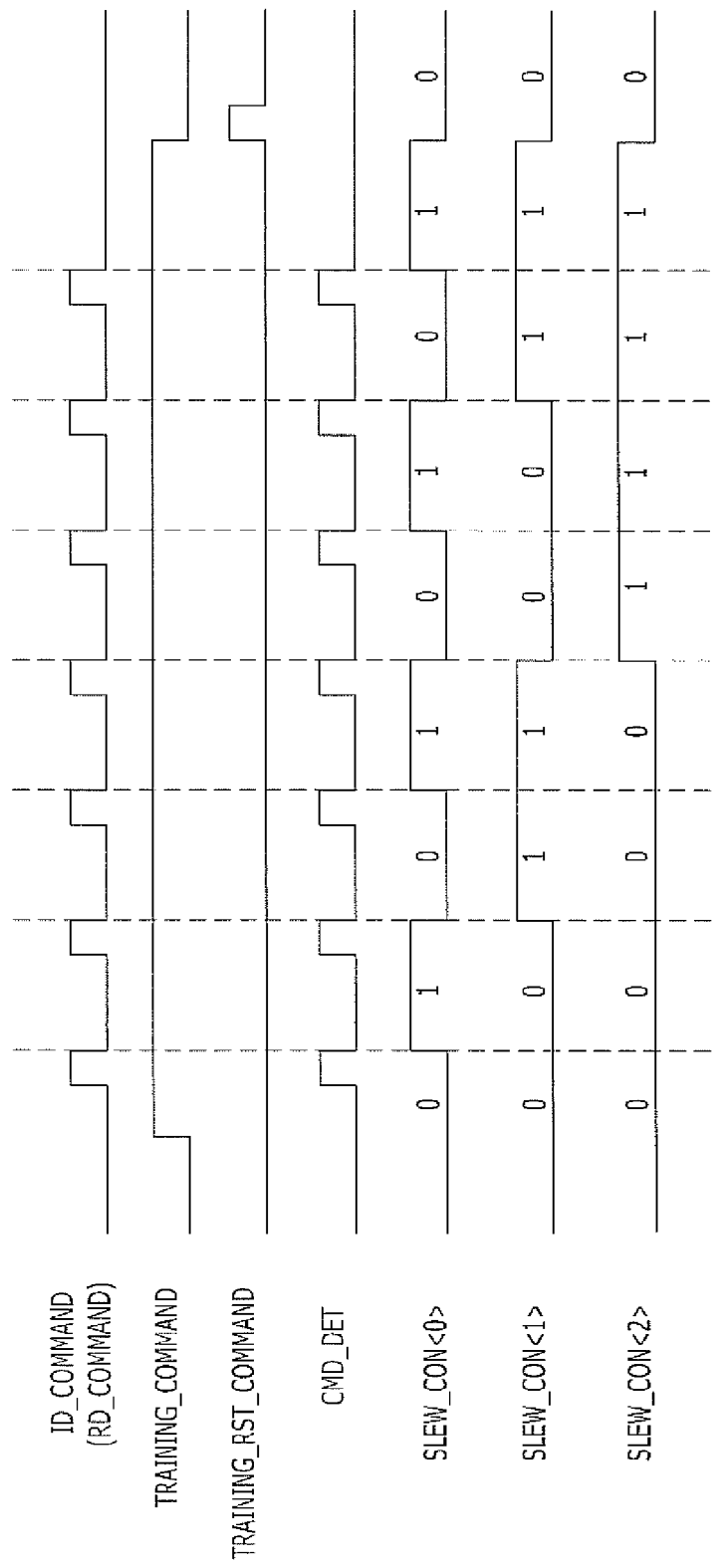
FIG. 8 is a timing diagram describing an operation of the semiconductor memory device shown in FIG. 3.

FIG. 8 is a timing diagram describing an operation of the semiconductor memory device shown in FIG. 3.

Referring to FIG. 8, the semiconductor memory device according to an exemplary embodiment of the present invention determines whether to enable or disable each bit of the slew rate control signal SLEW_CON<0:2> in response to the input of the predetermined command ID_COMMAND in a duration where the training operation command TRAINING_COMMAND is enabled.

To be specific, after the training operation command TRAINING_COMMAND is enabled from a logic low level to a logic high level, the command detection signal CMD_DET is pulsed/activated whenever the predetermined command ID_COMMAND is inputted.

The bits of the slew rate control signal SLEW_CON<0:2> which all had a logic low level when the training operation command TRAINING_COMMAND is at a logic low level are alternately enabled to a logic high level and disabled to a logic low level whenever the command detection signal CMD_DET toggles after the training operation command TRAINING_COMMAND is enabled to a logic high level.

Here, in the timing diagram illustrated in FIG. 8, whenever the command detection signal CMD_DET toggles, bits of the slew rate control signal SLEW_CON<0:2> are sequentially changed in eight steps as follows: '000'→'001'→'010'→'011'→'100'→'101'→'110'→'111'.

In short, the semiconductor memory device in accordance with an exemplary embodiment of the present invention generates the pull-up data PD_DATA and the pull-down data PD_DATA by controlling the slew rate in a total of 8 steps and driving the pattern data PT_DATA_UP and PT_DATA_DN in the pre-driver 312, whenever the predetermined command ID_COMMAND is transferred from the outside.

Of course, since controlling the enabling or disabling state of each bit of the slew rate control signal SLEW_CON<0:2> as shown in the timing diagram of FIG. 8 is just one embodiment and the controlling may be performed in any other way according to the design of a system, the scope and spirit of the present invention is not limited to the controlling method shown in FIG. 8.

The semiconductor memory device described in the above embodiment of the present invention may control the slew rate of the output data QUIT_DATA outputted from the semiconductor memory device in response to a general command signal, e.g., the predetermined command ID_COMMAND or the read command RD_COMMAND, in a duration where the training operation command TRAINING_COMMAND is enabled. The general command signal and the training operation command TRAINING_COMMAND may be outputted from the outside of the semiconductor memory device. However, such a control code to control the slew rate of the output data QUIT_DATA outputted from the semiconductor memory device is not to be additionally provided.

Therefore, although the setup/hold time of the output data QUIT_DATA is not sufficiently secured in a mounted semiconductor memory device due to an unstable external power source or varying environmental temperature, the semiconductor memory device may secure the setup/hold time of the output data QUIT_DATA by entering the training operation mode and controlling the slew rate of the output data QUIT_DATA internally. In short, the semiconductor memory device in accordance with an exemplary embodiment of the present invention may maintain a sufficient setup/hold time of the output data QUIT_DATA all the time, although a severe change occurs in the surrounding environment while the semiconductor memory device is mounted.

Figure 9:
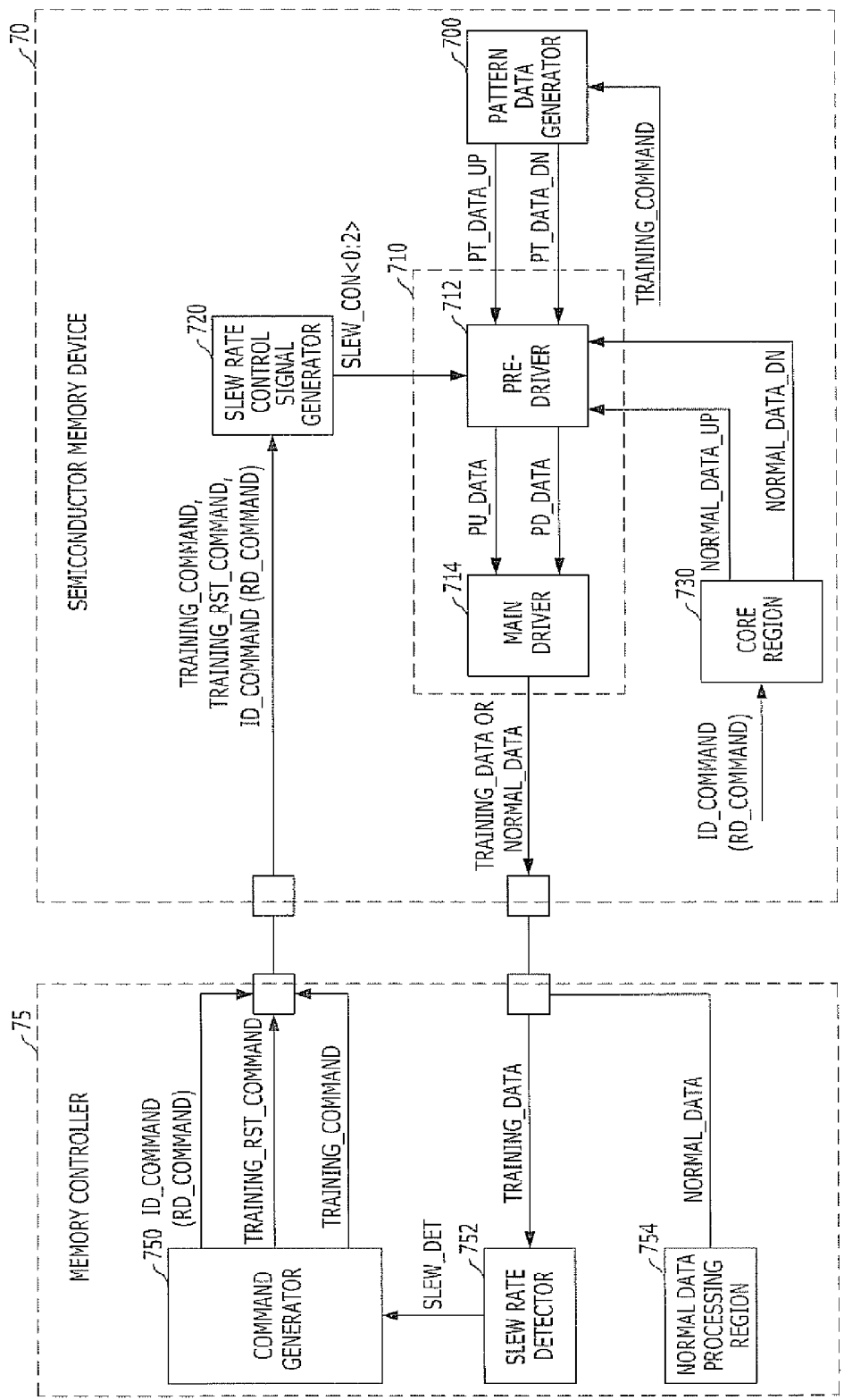
FIG. 9 is a block diagram describing a semiconductor system including the semiconductor memory device shown in FIG. 3.

FIG. 9 is a block diagram describing a semiconductor system including the semiconductor memory device shown in FIG. 3.

Referring to FIG. 9, the semiconductor system includes a memory controller 75 and a semiconductor memory device 70. The memory controller 75 detects the slew rate of a training data TRAINING_DATA transferred from the semiconductor memory device 70 and determines whether to generate a predetermined command ID_COMMAND based on the detection result. The semiconductor memory device 70 controls the slew rate of the training data TRAINING_DATA in response to the predetermined command ID_COMMAND transferred from the memory controller 75 in a training operation mode.

Here, the memory controller 75 includes a command generator 750 and a slew rate detector 752. The command generator 750 generates the predetermined command ID_COMMAND under the control of a slew rate detection signal SLEW_DET. The slew rate detector 752 detects the slew rate of the training data TRAINING_DATA and determines the value of the slew rate detection signal SLEW_DET based on the slew rate detection result.

Also, the command generator 750 may not only generate the predetermined command ID_COMMAND but also generate a training operation command TRAINING_COMMAND and a training reset command TRAINING_RST_COMMAND. Here, the training operation command TRAINING_COMMAND is used to control the semiconductor memory device 70 to enter or exit a training operation mode. Also, the training reset command TRAINING_RST_COMMAND is used to control the slew rate of the training data TRAINING_DATA in the training operation mode to be applied as a slew rate of a normal data NORMAL_DATA in a normal operation mode. Here, among the predetermined command ID_COMMAND, the training reset command TRAINING_RST_COMMAND, and the training operation command TRAINING_COMMAND that are generated in the command generator 750, the predetermined command ID_COMMAND is only controlled to be generated based on the slew rate detection signal SLEW_DET. In other words, whether to enable the training operation command TRAINING_COMMAND and the training reset command TRAINING_RST_COMMAND is determined independently regardless of whether the slew rate detection signal SLEW_DET is enabled or not.

Also, in FIG. 9, the command generator 750 generates three command signals, which are the training operation command TRAINING_COMMAND, the training reset command TRAINING_RST_COMMAND and the predetermined command ID_COMMAND, and then transfers them to the semiconductor memory device 70. This is to represent that diverse kinds of commands may be transferred from the memory controller 75 to the semiconductor memory device 70, and in reality, the command generator 750 may transfer a write enable (WE) signal, a row address strobe (RAS) signal, a column address strobe (CAS) signal, and a chip enable (CE) signal used for the general operations to the semiconductor memory device 70, and the semiconductor memory device 70 may generate the corresponding command signals. In short, only the write enable (WE) signal, the row address strobe (RAS) signal, the column address strobe (CAS) signal, and the chip enable (CE) signal are transferred from the memory controller 75 to the semiconductor memory device 70, and the training operation command TRAINING_COMMAND, the training reset command TRAINING_RST_COMMAND and the predetermined command ID_COMMAND are generated in a command decoder (not shown) included inside of the semiconductor memory device 70.

The slew rate detector 752 enables and outputs the slew rate detection signal SLEW_DET when the slew rate of the training data TRAINING_DATA is in a predetermined slew rate range. When the slew rate of the training data TRAINING_DATA is out of the predetermined slew rate range, the slew rate detector 752 disables and outputs the slew rate detection signal SLEW_DET. Herein, the predetermined slew rate range may be changed as desired. At this time, the command generator 750 generates the predetermined command ID_COMMAND at a predetermined period in a duration where the slew rate detection signal SLEW_DET is disabled, and the command generator 750 does not generate the predetermined command ID_COMMAND in a duration where the slew rate detection signal SLEW_DET is enabled.

In another embodiment, the slew rate detector 752 may maintain the slew rate detection signal SLEW_DET in a disabled state when the slew rate of the training data TRAINING_DATA is in a predetermined slew rate range, and the slew rate detector 752 may enable the slew rate detection signal SLEW_DET to toggle when the slew rate of the training data TRAINING_DATA is out of the predetermined slew rate range. At this time, the command generator 750 generates the predetermined command ID_COMMAND whenever the slew rate detection signal SLEW_DET toggles.

The overall structure of the semiconductor memory device 70 is similar to the semiconductor memory device illustrated in FIGS. 3 to 5. However, the names of some signals and the detailed description of the operation are changed according to the connection relationship with the memory controller 75.

To be specific, the semiconductor memory device 70 includes a pattern data generator 700 and an output driver 710. The pattern data generator 700 generates pattern data PT_DATA_UP and PT_DATA_DN in a training operation mode where the training operation command TRAINING_COMMAND transferred from the memory controller 75 is enabled. The output driver 710 transfers a training data TRAINING_DATA to the memory controller 75, which is generated by driving the pattern data PT_DATA_UP and PT_DATA_DN to have a slew rate corresponding to the predetermined command ID_COMMAND in the training operation mode where the training operation command TRAINING_COMMAND is enabled. Also, the semiconductor memory device 70 further includes a slew rate control signal generator 720 which generates a slew rate control signal SLEW_CON<0:2> in response to the predetermined command ID_COMMAND in the training operation mode where the training operation command TRAINING_COMMAND is enabled.

Here, the slew rate control signal generator 720 changes the value of the slew rate control signal SLEW_CON<0:2> whenever the predetermined command ID_COMMAND is transferred from the memory controller 75 in the training operation mode where the training operation command TRAINING_COMMAND transferred from the memory controller 75 is enabled. Conversely, the slew rate control signal generator 720 does not change the value of the slew rate control signal SLEW_CON<0:2> regardless of the predetermined command ID_COMMAND in a normal operation mode where the training operation command TRAINING_COMMAND, transferred from the memory controller 75, is disabled.

Although not directly illustrated in the drawing, the slew rate control signal generator 720 may include a command detection signal generation unit 322 and a counting unit 324, as illustrated in FIG. 5. The command detection signal generation unit 322 generates a command detection signal COM_DET which is pulsed/activated whenever the predetermined command ID_COMMAND is inputted from the memory controller 75 in the training operation mode. The counting unit 324 determines the value of each bit of the slew rate control signal SLEW_CON<0:2> by counting the toggling number of the command detection signal CMD_DET.

The output driver 710 includes a pre-driver 712 and a main driver 714. The pre-driver 712 generates a pull-up data PU_DATA and a pull-down data PD_DATA by driving the pattern data PT_DATA_UP and PT_DATA_DN to have a slew rate corresponding to the slew rate control signal SLEW_CON<0:2>. The main driver 714 transfers a training data TRAINING_DATA which is generated by driving the pull-up data PU_DATA and the pull-down data PD_DATA to the memory controller 75.

The pre-driver 712 may have the same structure as that of FIG. 6. To be specific, the pre-driver 712 drives the pattern data PT_DATA_UP and PT_DATA_DN and outputs them as the pull-up data PU_DATA and the pull-down data PD_DATA, and the pre-driver 712 includes a plurality of pre-driver units PREDRV_UP0, PREDRV_DN0, PREDRV_UP1, PREDRV_DN1, PREDRV_UP2, and PREDRV_DN2 whose driving operations are turned on/off in response to each bit of the slew rate control signal SLEW_CON<0:2>.

Also, the counting unit 324 may reset the state of each bit of the slew rate control signal SLEW_CON<0:2>, which is determined in a duration where the training operation command TRAINING_COMMAND is enabled, into an initial state or maintain it in a duration where the training operation command TRAINING_COMMAND is disabled, depending on a training reset command TRAINING_RST_COMMAND which is transferred from the memory controller 75.

Also, the predetermined command ID_COMMAND transferred from the memory controller 75 to the semiconductor memory device 70 may correspond to a read command RD_COMMAND used in the general operation of a semiconductor memory device. In short, responding to a read command RD_COMMAND transferred from the memory controller 75 to the semiconductor memory device 70 in a duration where the training operation command TRAINING_COMMAND is enabled, the slew rate of the training data TRAINING_DATA transferred from the semiconductor memory device 70 to the memory controller 75 may be controlled. On the other hand, in a duration where the training operation command TRAINING_COMMAND is disabled, a normal data NORMAL_DATA transferred from a core region 730 inside of the semiconductor memory device 70 may be transferred from the semiconductor memory device 70 to the memory controller 75 through the pre-driver 712 and the main driver 714 in response to the read command RD_COMMAND transferred from the memory controller 75 to the semiconductor memory device 70.

When the normal data NORMAL_DATA is transferred to the memory controller 75, it is used for a predetermined operation in a normal data processing region 754 inside of the memory controller 75. For example, the normal data NORMAL_DATA may be transferred to the outside of the semiconductor system. Of course, the operation in the normal data processing region 754 may be different according to a system design and it does not limit the scope and spirit of the present invention.

Also, the predetermined command ID_COMMAND may correspond to any command other than the read command RD_COMMAND as long as the command is transferred from the outside to the semiconductor memory device. That is, the command may be newly defined, and such correspondence between the predetermined command and others does not limit the scope and spirit of the present invention.

Hereafter, an operation of a semiconductor system in accordance with an exemplary embodiment of the present invention is described.

First, a training operation command TRAINING_COMMAND is enabled in a memory controller 75 and applied to the semiconductor memory device 70. In response to the received enabled training operation command TRAINING_COMMAND, the semiconductor memory device 70 generates a training data TRAINING_DATA and transfers the training data TRAINING_DATA to the memory controller 75. The first training data TRAINING_DATA which is first transferred from the semiconductor memory device 70 to the memory controller 75 has an initial slew rate.

The memory controller 75 checks whether the initial slew rate of the first training data TRAINING_DATA is in a predetermined slew rate range. When it is determined that the initial slew rate of the first training data TRAINING_DATA is out of the predetermined slew rate range, the memory controller 75 generates a predetermined command ID_COMMAND and transfers the generated predetermined command ID_COMMAND to the semiconductor memory device 70. Here, the training operation command TRAINING_COMMAND remains enabled.

When the predetermined command ID_COMMAND is transferred from the memory controller 75 to the semiconductor memory device 70 while the training operation command TRAINING_COMMAND remains enabled, the semiconductor memory device 70 generates another training data TRAINING_DATA, which is referred to as a second training data TRAINING_DATA, and transfers the second training data TRAINING_DATA to the memory controller 75. The second training data TRAINING_DATA does not have the initial slew rate but has a slew rate which is changed from the initial slew rate by a predetermined size.

When the second training data TRAINING_DATA having the changed slew rate is transferred from the semiconductor memory device 70 to the memory controller 75, the memory controller 75 checks whether the changed slew rate of the second training data TRAINING_DATA is in the predetermined slew rate range. When it is determined that the changed slew rate of the second training data TRAINING_DATA is out of the predetermined slew rate range, the memory controller 75 generates the predetermined command ID_COMMAND and transfers the generated predetermined command ID_COMMAND to the semiconductor memory device 70. Here, the training operation command TRAINING_COMMAND remains enabled.

When the predetermined command ID_COMMAND is transferred again from the memory controller 75 to the semiconductor memory device 70 while the training operation command TRAINING_COMMAND remains enabled, the semiconductor memory device 70 generates yet another training data TRAINING_DATA, which is referred to as a third training data TRAINING_DATA, and transfers the third training data TRAINING_DATA to the memory controller 75. The third training data TRAINING_DATA has a slew rate which is changed from the slew rate of the second training data TRAINING_DATA by a predetermined size.

The above repeated transfer of the training data TRAINING_DATA and the predetermined command ID_COMMAND between the semiconductor memory device 70 and the memory controller 75 ends when the following condition is achieved.

In the first place, when it is determined that the slew rate of the training data TRAINING_DATA transferred from the semiconductor memory device 70 to the memory controller 75, which may be the initial slew rate or a changed slew rate, is in the predetermined slew rate range, the memory controller 75 does not generate the predetermined command ID_COMMAND anymore. Therefore, no predetermined command ID_COMMAND is transferred to the semiconductor memory device 70. Accordingly, the semiconductor memory device 70 does not generate any training data TRAINING_DATA. In other words, since the slew rate of the training data TRAINING_DATA generated in the semiconductor memory device 70 belongs to the predetermined slew rate range, it is not changed.

When the training operation is completed, the memory controller 75 disables the training operation command TRAINING_COMMAND and the training operation mode is exited.

Secondly, a case may exist in which all available slew rates have been applied to the training data TRAINING_DATA and it is still determined that the slew rates are out of the predetermined slew rate range. In this case, although the purpose of the training operation mode is not achieved, the memory controller 75 disables the training operation command TRAINING_COMMAND and exits the training operation mode.

Thirdly, the training operation command TRAINING_COMMAND may be forcibly disabled due to a reason such as the initialization of the semiconductor system and exiting of the training operation mode. In this case, the slew rates of the training data TRAINING_DATA changed during training operation mode become meaningless values, and a training reset command TRAINING_RST_COMMAND is transferred from the memory controller 75 to the semiconductor memory device 70 to set the slew rate back to its initial rate.

Hereafter, the operation of transferring the training data TRAINING_DATA having the initial slew rate from the semiconductor memory device 70 to the memory controller 75 is described in detail. In response to the enabling of the training operation command TRAINING_COMMAND, the semiconductor memory device 70 generates the pattern data PT_DATA_UP and PT_DATA_DN having a predetermined pattern, drives them into the training data TRAINING_DATA having the initial slew rate, and transfers the training data TRAINING_DATA having the initial slew rate to the memory controller 75.

Hereafter, the operation of transferring the training data TRAINING_DATA having a changed slew rate from the semiconductor memory device 70 to the memory controller 75 is described in detail. Since the training operation command TRAINING_COMMAND remains enabled, the pattern data PT_DATA_UP and PT_DATA_DN, having the predetermined pattern, continue to be generated. Independently from the generation of the pattern data PT_DATA_UP and PT_DATA_DN, the semiconductor memory device 70 pulses/activates the command detection signal CMD_DET whenever the predetermined command ID_COMMAND is transferred from the memory controller 75 to the semiconductor memory device 70. The semiconductor memory device 70 generates the bits of the slew rate control signal SLEW_CON<0:2> whose enabling or disabling is determined based on the toggling number of the command detection signal CMD_DET, drives the pattern data PT_DATA_UP and PT_DATA_DN into the training data TRAINING_DATA having a changed slew rate based on each bit of the slew rate control signal SLEW_CON<0:2>, and transfers the training data TRAINING_DATA having the changed slew rate to the memory controller 75. Here, the variation width of the changed slew rate of the training data TRAINING_DATA is determined based on the toggling number of the command detection signal CMD_DET.

Hereafter, the operation of generating the predetermined command ID_COMMAND in the memory controller 75 and transferring the generated predetermined command ID_COMMAND to the semiconductor memory device 70 is described. Whether to generate the predetermined command ID_COMMAND is determined based on whether the slew rate detection signal SLEW_DET is enabled or not. Here, whether the slew rate detection signal SLEW_DET is enabled or not is determined based on the slew rate of the training data TRAINING_DATA transferred from the semiconductor memory device 70. To be specific, the slew rate of the training data TRAINING_DATA transferred from the semiconductor memory device 70 to the memory controller 75 is detected, and when the detected slew rate is in a predetermined slew rate range the slew rate detection signal SLEW_DET is enabled and outputted. Accordingly, the predetermined command ID_COMMAND is not generated and thus no predetermined command ID_COMMAND is transferred from the memory controller 75 to the semiconductor memory device 70. However, when the detected slew rate of the training data TRAINING_DATA is out of the predetermined slew rate range, the slew rate detection signal SLEW_DET is disabled and the disabled slew rate detection signal SLEW_DET is outputted. Accordingly, the predetermined command ID_COMMAND is generated at a predetermined period and the generated predetermined command ID_COMMAND is transferred from the memory controller 75 to the semiconductor memory device 70.

The semiconductor system according to exemplary embodiments of the present invention, which are described above, may control the slew rate of the training data TRAINING_DATA which is transferred from the semiconductor memory device 70 to the memory controller 75 in response to a general command signal, which signifies the predetermined command ID_COMMAND or a read command RD_COMMAND, transferred from the memory controller 75 to the semiconductor memory device 70 in a duration where the training operation command TRAINING_COMMAND, which is also transferred from the memory controller 75 to the semiconductor memory device 70, maintains an enabling state. In short, even with a simple operation of transferring several commands from the memory controller 75 to the semiconductor memory device 70, it is possible to control the slew rate of a data outputted from the semiconductor memory device 70, which is the training data TRAINING_DATA in the training operation mode and the normal data NORMAL_DATA in the normal operation mode.

Therefore, although the setup/hold time of the output data (i.e., the normal data NORMAL_DATA or the training data TRAINING_DATA) of the semiconductor memory device 70 is not sufficiently secured because an external power source is unstable or environmental temperature changes when the semiconductor memory device 70 is used in a mounted state, it is possible to secure the setup/hold time of the output data NORMAL_DATA or TRAINING_DATA by transferring several commands from the memory controller 75 to the semiconductor memory device 70 and making the semiconductor memory device 70 enter the training operation mode. In short, the semiconductor system in accordance with exemplary embodiments of the present invention may maintain sufficient setup/hold time of the output data NORMAL_DATA or TRAINING_DATA of the semiconductor memory device 70 all the time, although a change occurs in the surrounding environment while the semiconductor memory device 70 is mounted.

According to an exemplary embodiment of the present invention, it is possible to acquire the optimal signal quality because a slew rate of data output signals may be automatically controlled through an operation of entering/exiting a slew rate training operation mode, even when semiconductor memory devices have non-uniform data output signals due to the difference in fabrication processes and acceleration in data processing rate.

While the present invention has been described with respect to the specific embodiments, it will be apparent to those skilled in the art that various changes and modifications may be made without departing from the spirit and scope of the invention as defined in the following claims.

What is claimed is:
1. A semiconductor system, comprising:
a memory controller configured to detect a slew rate of training data in a training operation mode and determine whether to generate a predetermined command based on a slew rate detection result; and
a semiconductor memory device configured to control the slew rate of the training data in response to the predetermined command and output the training data to the memory controller in the training operation mode,
wherein the semiconductor memory device comprises:
a pattern data generator configured to generate pattern data in the training operation mode;
a slew rate control signal generator configured to generate a slew rate control signal that changes in response to the predetermined command in the training operation mode; and
an output driver configured to drive the pattern data with a driving force corresponding to the slew rate control signal to generate the training data, wherein the slew rate control signal generator comprises:
a command detection signal generation unit configured to generate a command detection signal which is activated whenever the predetermined command is inputted from the memory controller in the training operation mode; and
a counting unit configured to determine a value of each bit of the slew rate control signal by counting a toggling number of the command detection signal.

2. The semiconductor system of claim 1, wherein the memory controller comprises:
a slew rate detector for detecting the slew rate of the training data and determining a value of a slew rate detection signal based on the slew rate detection result; and
a command generator for generating the predetermined command based on the slew rate detection signal.

3. The semiconductor system of claim 2, wherein the slew rate detector enables the slew rate detection signal when the slew rate of the training data is in a predetermined slew rate range, and
the slew rate detector disables the slew rate detection signal when the slew rate of the training data is out of the predetermined slew rate range.

4. The semiconductor system of claim 3, wherein the command generator generates the predetermined command at a predetermined period in a duration where the slew rate detection signal is disabled, and
the command generator stops generating the predetermined command in a duration where the slew rate detection signal is enabled.

5. The semiconductor system of claim 2, wherein the slew rate detector maintains the slew rate detection signal in a disabled state when the slew rate of the training data is in a predetermined slew rate range, and
the slew rate detector toggles the slew rate detection signal when the slew rate of the training data is out of the predetermined slew rate range.

6. The semiconductor system of claim 5, wherein the command generator generates the predetermined command whenever the slew rate detection signal toggles.

7. The semiconductor system of claim 2, wherein the command generator further generates a training operation command for controlling an entry into the training operation mode, and a training reset command for controlling the slew rate of the training data determined in the training operation mode to be applied as a slew rate of normal data in a normal operation mode.

8. The semiconductor system of claim 1 wherein the output driver outputs the training data to the memory controller and comprises a plurality of pre-driver units of which a driving operation is controlled to be turned on/off in response to each bit of the slew rate control signal.

9. The semiconductor system of claim 8, wherein the slew rate control signal generator resets the value of each bit of the slew rate control signal to a predetermined value in response to a training reset command, which is inputted from the memory controller, when in the training operation mode, and
maintains the value of each bit of the slew rate control signal when out of the training operation mode.

10. A method for operating a semiconductor system comprising a semiconductor memory device and a memory controller, the method comprising:
entering a training operation mode in response to a training operation command being enabled;
controlling a slew rate of training data in response to a predetermined command in the training operation mode;
detecting the slew rate of the training data to produce a slew rate detection result and determining whether or not to generate the predetermined command based on the slew rate detection result;
generating normal data having a first slew rate when the training operation command is disabled and a training reset command is enabled; and
generating normal data having a second slew rate when the training operation command is disabled and the training reset command is disabled.

11. The method of claim 10, wherein the controlling of the slew rate of the training data comprises:
generating the training data having the first slew rate in the training operation mode; and
generating the training data having the second slew rate based on whether the predetermined command is generated or not.

12. The method of claim 11, wherein the entering into the training operation mode is performed when the training operation command, generated in the semiconductor system, is inputted to the semiconductor memory device.

13. The method of claim 11, wherein the generating of the training data having the first slew rate comprises:
generating pattern data having a predetermined pattern when the training operation command is enabled; and
driving the pattern data to generate the training data having the first slew rate and transferring the training data having the first slew rate to the memory controller.

14. The method of claim 11, wherein the generating of the training data having the second slew rate comprises:
generating pattern data having a predetermined pattern when the training operation command is enabled; and
driving the pattern data to generate the training data having the second slew rate and transferring the training data having the second slew rate to the memory controller whenever the predetermined command is inputted from the memory controller.

15. The method of claim 14, wherein the driving of the pattern data to generate the training data having the second slew rate and transferring of the training data having the second slew rate to the memory controller comprises:
counting the number of times that the predetermined command is inputted from the memory controller to produce a count result; and
driving the pattern data to generate the training data having the second slew rate whose value is changed based on the count result and transferring the training data to the memory controller.

16. The method of claim 10, wherein the detecting of the slew rate of the training data and the determining of whether or not to generate the predetermined command comprises:
detecting the slew rate of the training data transferred from the semiconductor memory device; and
generating the predetermined command when the detected slew rate is in a predetermined slew rate range.

* * * * *